(12) United States Patent
Xu

(10) Patent No.: US 11,739,890 B2
(45) Date of Patent: Aug. 29, 2023

(54) SYSTEM FOR DETECTING LED

(71) Applicant: CHONGQING KONKA PHOTOELECTRIC TECHNOLOGY RESEARCH INSTITUTE CO., LTD., Chongqing (CN)

(72) Inventor: Shiyuan Xu, Guangdong (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 235 days.

(21) Appl. No.: 17/117,884

(22) Filed: Dec. 10, 2020

(65) Prior Publication Data
US 2021/0095822 A1  Apr. 1, 2021

Related U.S. Application Data

(63) Continuation-in-part of application No. PCT/CN2019/109697, filed on Sep. 30, 2019.

(51) Int. Cl.
| | |
|---|---|
| *H01L 33/48* | (2010.01) |
| *F21K 9/275* | (2016.01) |
| *H01L 33/42* | (2010.01) |
| *H01L 33/50* | (2010.01) |
| *H01L 33/62* | (2010.01) |
| *G01R 31/26* | (2020.01) |

(Continued)

(52) U.S. Cl.
CPC ............ *F21K 9/275* (2016.08); *G01J 1/4257* (2013.01); *G01R 31/2635* (2013.01); *G01R 31/44* (2013.01); *H01L 22/10* (2013.01); *H01L 33/42* (2013.01); *H01L 33/486* (2013.01); *H01L 33/507* (2013.01); *H01L 33/62* (2013.01); *F21Y 2115/10* (2016.08)

(58) Field of Classification Search
CPC . G01J 1/4257; G01R 31/2635; F21Y 2115/10
USPC .................................... 356/218, 237.2–237.6
See application file for complete search history.

(56) References Cited

U.S. PATENT DOCUMENTS

| | | | |
|---|---|---|---|
| 9,546,926 B2* | 1/2017 | Ji | G01J 1/42 |
| 2002/0044140 A1* | 4/2002 | Inukai | G09G 3/2022 |
| | | | 345/204 |

(Continued)

FOREIGN PATENT DOCUMENTS

| | | |
|---|---|---|
| CN | 102290406 A | 12/2011 |
| CN | 104576695 A | 4/2015 |

(Continued)

OTHER PUBLICATIONS

International Search Report issued in corresponding International Application No. PCT/CN2019/109697, dated Jun. 30, 2020, pp. 1-9, State Intellectual Property Office of the P.R. China, Beijing, China.

(Continued)

*Primary Examiner* — Isiaka O Akanbi
(74) *Attorney, Agent, or Firm* — Hauptman Ham, LLP

(57) ABSTRACT

A system for detecting a light-emitting diode (LED) is provided. The system includes a first transparent substrate and multiple thin film transistors (TFT) disposed on the first transparent substrate and controlled separately, where the multiple TFTs are in one-to-one correspondence with LEDs to-be-detected in terms of location.

14 Claims, 3 Drawing Sheets

(51) Int. Cl.
  *G01J 1/42* (2006.01)
  *G01R 31/44* (2020.01)
  *H01L 21/66* (2006.01)
  *F21Y 115/10* (2016.01)

(56) References Cited

U.S. PATENT DOCUMENTS

| | | | | |
|---|---|---|---|---|
| 2002/0132383 | A1* | 9/2002 | Hiroki | H01L 22/14 |
| | | | | 257/E27.113 |
| 2003/0090599 | A1* | 5/2003 | Ochiai | G02F 1/136213 |
| | | | | 349/39 |
| 2005/0046847 | A1* | 3/2005 | Cromwell | B01L 3/5085 |
| | | | | 356/417 |
| 2008/0074401 | A1* | 3/2008 | Chung | G02F 1/1368 |
| | | | | 345/175 |
| 2011/0084939 | A1* | 4/2011 | Gepner | G06F 3/017 |
| | | | | 345/175 |
| 2011/0157097 | A1* | 6/2011 | Hamada | G06F 3/0421 |
| | | | | 345/175 |
| 2012/0086019 | A1* | 4/2012 | Kaneko | G02F 1/13338 |
| | | | | 257/E33.076 |
| 2013/0068368 | A1* | 3/2013 | Kim | G01R 31/2635 |
| | | | | 356/138 |
| 2013/0127790 | A1* | 5/2013 | Wassvik | G06F 3/0428 |
| | | | | 345/175 |
| 2015/0042582 | A1* | 2/2015 | An | G06F 3/0421 |
| | | | | 345/173 |
| 2016/0049431 | A1* | 2/2016 | Taghibakhsh | H01L 27/14689 |
| | | | | 257/53 |
| 2017/0261310 | A1 | 9/2017 | Eun et al. | |
| 2019/0004105 | A1 | 1/2019 | Henley | |

FOREIGN PATENT DOCUMENTS

| | | |
|---|---|---|
| CN | 208352324 U | 1/2019 |
| CN | 109407902 A | 3/2019 |
| CN | 109449259 A | 3/2019 |
| CN | 109933237 A | 6/2019 |

OTHER PUBLICATIONS

The First Office Action issued in corresponding CN Application No. CN201980001983.1, dated Jul. 7, 2021, pp. 1-14, Beijing, China.

\* cited by examiner

SYSTEM FOR DETECTING LED

CROSS-REFERENCE TO RELATED APPLICATION(S)

This application is a continuation-in-part of International Application No. PCT/CN2019/109697, filed on Sep. 30, 2019, the entire disclosure of which is hereby incorporated by reference.

TECHNICAL FIELD

This disclosure relates to the field of light-emitting diode (LED) detection, and more particularly to a system for detecting an LED, a method for preparing a system for detecting an LED, and a method for detecting an LED.

BACKGROUND

With progress of science and technology and improvement of life quality, LED lamp beads (that is, LEDs) have been widely used in people's daily life. As illustrated in FIG. 1, before a large number of LED lamp beads (that is, LEDs) are installed, it is necessary to detect the LED lamp beads to ensure that the LED lamp beads can be used normally. Therefore, there is a need to detect each LED lamp bead on a carrier substrate in terms of photoelectric effect.

In the related art, as illustrated in FIG. 2, the most commonly used manner is to energize the LED lamp bead via a probe and receive light signals via a photodetector, to perform photodetection on each LED lamp bead one by one. Location data of an LED lamp bead that cannot work normally are transferred to a transfer machine. The transfer machine then removes the LED lamp bead that does not meet requirements. With the above manner, the probe needs to be mechanically moved when switching between LED lamp beads at different locations, to energize a large number of LED lamp beads respectively, which is low in efficiency. In addition, the probe may cover a luminous area of the LED lamp bead, which will adversely affect accuracy of measurement. Due to limitation of size of the probe, for an extremely small LED lamp bead, it may be difficult to align the probe with the LED lamp bead, or the probe is likely to crush the LED lamp bead.

In the above manner, there are a large quantity of measurement data and transfer data, and it is likely to make mistakes while detecting lamp beads and processing a large quantity of data. When the transfer machine transfers the LED lamp bead, precise optical alignment is required. Wrong data will lead to wrong transfer of the LED lamp bead, and as a result, it is impossible to completely distinguish between a normal lamp bead (that is, a normally operating lamp bead) and an abnormal lamp bead.

Therefore, the manner in the related art is in a need for improvement.

SUMMARY

To achieve the above purposes, implementations provide the following technical solutions.

In a first aspect, a system for detecting an LED includes a first transparent substrate and multiple thin film transistors (TFT) disposed on the first transparent substrate and controlled separately, where the multiple TFTs are in one-to-one correspondence with LEDs to-be-detected in terms of location.

In some implementations, the system further includes a conductive layer configured to be coupled with one electrode of each of the LEDs to-be-detected, where the other electrode of each of the LEDs to-be-detected is opposite to one of the multiple TFTs.

In some implementations, the system further includes a second transparent substrate on which the conductive layer is disposed.

In some implementations, each of the multiple TFTs and each of the LEDs are spaced apart by a gap.

In some implementations, the system further includes a sensor configured to detect whether each of the LEDs emits light normally.

In some implementations, the sensor is disposed below the second transparent substrate or disposed above the first transparent substrate.

In some implementations, the TFT includes a protective layer made of a dielectric material and covering a gate, a drain, and a source of the TFT.

In some implementations, the protective layer is made of silicon nitride ($Si_3N_4$), aluminum oxide ($Al_2O_3$), or hafnium dioxide ($HfO_2$).

In some implementations, the system further includes a metal line layer disposed between the first transparent substrate and the multiple TFTs and configured to be coupled with and control separately each of the multiple TFTs.

In a second aspect, a method for preparing a system for detecting an LED is provided. The method includes the following. A first transparent substrate is provided. Multiple TFTs are disposed on the first transparent substrate, where the multiple TFTs are controlled separately and in one-to-one correspondence with LEDs to-be-detected in terms of location.

In a third aspect, a method for detecting an LED is provided. The method includes the following. A driving voltage is applied to a metal line layer of a system for detecting an LED, to drive an LED to-be-detected to emit light. The system for detecting an LED includes: a first transparent substrate, multiple TFTs disposed on the first transparent substrate and controlled separately, and a sensor disposed below a second transparent substrate or disposed above the first transparent substrate, where the metal line layer is sandwiched between the first transparent substrate and the multiple TFTs, and the multiple TFTs are in one-to-one correspondence with LEDs to-be-detected in terms of location. Determine, by the sensor, that an LED to-be-detected is a normal LED when the LED to-be-detected emits light. Determine, by the sensor, that an LED to-be-detected is an abnormal LED when the LED to-be-detected does not emit light.

BRIEF DESCRIPTION OF THE DRAWINGS

In order to describe technical solutions of implementations or in the related art more clearly, the following will give a brief description of accompanying drawings used for describing the implementations or the related art. Apparently, accompanying drawings described below are merely some implementations. Those of ordinary skill in the art can also obtain other accompanying drawings based on the accompanying drawings provided below without creative efforts.

Figure 1:
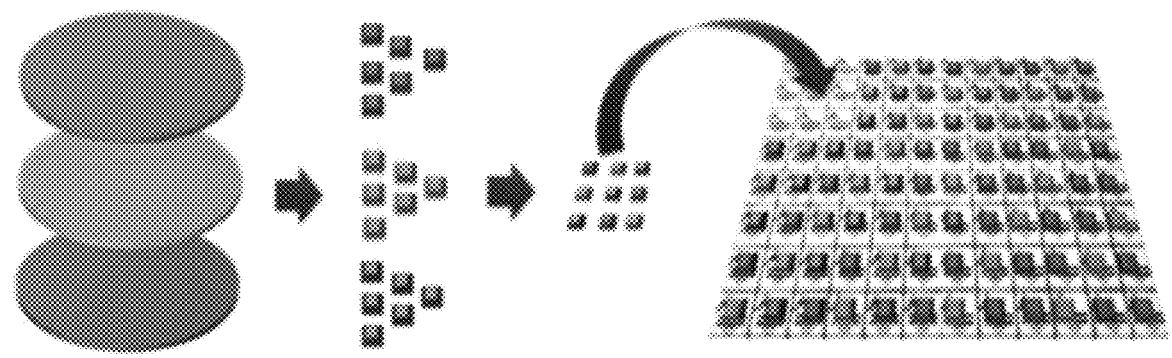
FIG. 1 is a flowchart illustrating production of an LED in the related art.
Figure 2:
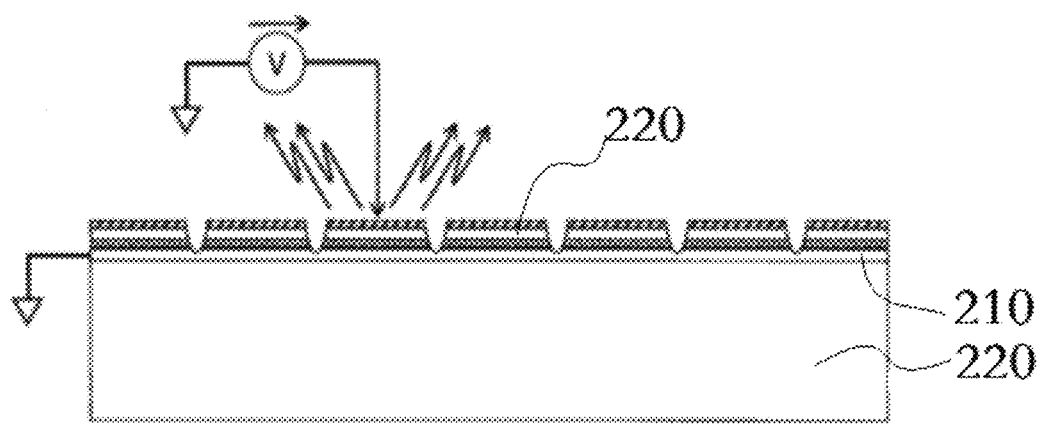
FIG. 2 is a schematic diagram illustrating principles of a system for detecting an LED in the related art.

In the drawings, 100: first transparent substrate; 110: TFT; 111: gate; 112: source; 113: drain; 114: protective layer; 120: metal line layer; 200: second transparent substrate; 210: conductive layer; 220: LED; 300: sensor.

DETAILED DESCRIPTION

Technical solutions of implementations will be described clearly and completely with reference to accompanying drawings in the implementations. Apparently, implementations hereinafter described are merely some implementations, rather than all implementations, of the disclosure. All other implementations obtained by those of ordinary skill in the art based on the implementations herein without creative efforts shall fall within the protection scope of the disclosure.

Figure 3:
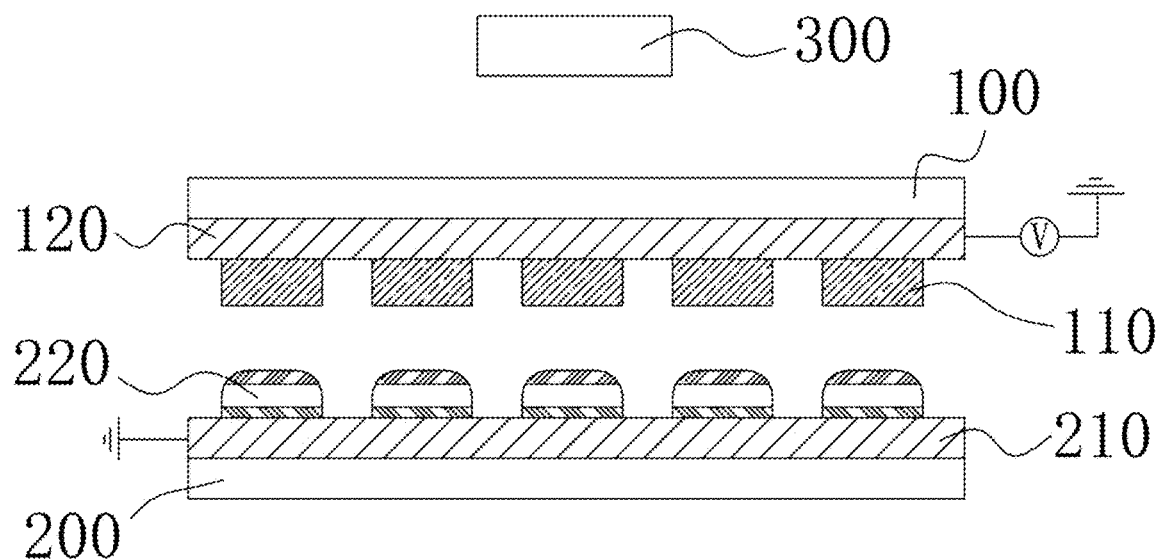
FIG. 3 is a cross-sectional view illustrating principles of a system for detecting an LED according to implementations.

As illustrated in FIG. 3, a system for detecting an LED is provided. The system includes a first transparent substrate 100. The first transparent substrate 100 is used as a backplane and made of a transparent material with an excellent optical performance, such as polymethyl methacrylate (PMMA, that is, plexiglass), polycarbonate, or the like. The transparent material with an excellent optical performance allows lights emitted by an LED 220 to pass through. The lights emitted by the LED 220 can be detected by a sensor 300 that is disposed above the first transparent substrate 100.

The first transparent substrate 100 is provided with multiple TFTs 110, where the TFT refers to "thin film transistor". Each of the multiple TFTs 110 can be controlled separately. The multiple TFTs 110 are in one-to-one correspondence with LEDs 220 to-be-detected in terms of location. Each TFT 110 corresponds to one LED 220.

After detection of the LED is completed, location data of a normal LED are obtained. By applying a voltage to a TFT corresponding to the normal LED in terms of location, the TFT will generate static electricity to absorb the LED that meets requirements, which is possible to achieve a precise batch transfer of LEDs. Since the TFTs are in one-to-one correspondence with the LEDs to-be-detected in terms of location, measurement data and transfer data can be directly integrated, and as such, no error will occur during processing of a large quantity of data. Since the TFT directly replaces a transfer machine, while transferring an LED lamp bead, the TFT can be directly aligned with the LED lamp bead to avoid error in alignment, such that normal lamp beads can be accurately distinguished from abnormal lamp beads.

Figure 5:
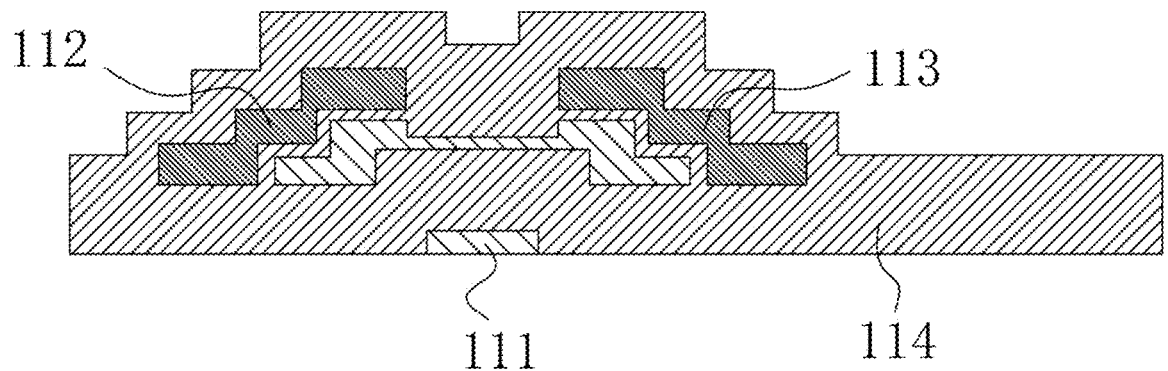
FIG. 5 is a cross-sectional view of a TFT of a system for detecting an LED according to implementations.

As illustrated in FIG. 5, the TFT 110 includes a gate 111, a drain 113, a source 112, and a protective layer 114 that covers an inner metal part. The gate 111, the drain 113, and the source 112 are coated with aluminum titanium alloy. The source 112 is coupled with the drain 113 through a channel layer of amorphous silicon. Silicon with high phosphorus concentration is disposed between the source 112 and the channel layer as well as between the drain 113 and the channel layer. The silicon with high phosphorus concentration can reduce an interfacial potential difference, such that the source 112 is in Ohmic contact with the channel layer. Outside the TFT 110 is the protective layer 114. The protective layer 114 is made of a dielectric material, such as silicon nitride ($Si_3N_4$), aluminum oxide ($Al_2O_3$), hafnium dioxide ($HfO_2$), etc. The protective layer 114 is also used as a via layer, such that electrical signals can be directed into the TFT. An indium tin oxide (ITO) layer coated with ITO (that is, ITO semiconductor transparent conductive layer) is disposed outside part of the protective layer 114. The composition of the TFT 110 may be various, as long as functions of the TFT 110 provided herein can be achieved, which shall fall within the protection scope of the disclosure.

In some implementations, the system further includes a conductive layer 210 (that is, a layer that is electrically conductive). The conductive layer 210 may be an electrically conductive adhesive. The electrically conductive adhesive is an adhesive with conductivity after curing or drying. The conductive layer 210 is provided with multiple LEDs 220 to-be-detected. Each LED 220 is arranged in one-to-one correspondence with one of the multiple TFTs 110. The conductive layer 210 connects one electrode of each of the multiple LEDs 220 together, such that the multiple LEDs 220 share a same electrode. The other electrode of each of the multiple LEDs 220 is opposite to one of the multiple TFTs. In order for the sensor 300 to receive clear optical signals from the multiple LEDs 220 for detection, the multiple LEDs 220 is evenly arranged on the conductive layer 210, and as such, each LED 220 can emit light normally without being blocked, which facilitates detection by the sensor 300.

In some implementations, in order for the conductive layer 210 and the LEDs 220 to be integrally formed, thereby facilitating transportation or installation during detection, the system for detecting an LED provided herein further includes a second transparent substrate 200. The conductive layer 210 is fixed on the second transparent substrate 200. The multiple LEDs 220 to-be-detected are fixed on the second transparent substrate 200 via the conductive layer 210. The second transparent substrate 200 is made of a transparent material with an excellent optical performance, such as PMMA (that is, plexiglass). Light emitted by the LED 220 can pass through the second transparent substrate 200, such that the sensor 300 disposed below the second transparent substrate 200 can accurately detect whether the LED 220 operates normally, which will not affect accuracy of detection by the sensor 300.

In some implementations, the multiple TFTs 110 are disposed in one-to-one correspondence with the multiple LEDs 220, and each of the multiple TFTs 110 and each of the multiple LEDs 220 are spaced apart by a gap. The size of the gap can be adjusted according to parameters of the LED 220, parameters of the TFT 110, and the magnitude of a voltage applied to the TFT 110.

In some implementations, the sensor 300 can also be disposed below the second transparent substrate 200. The sensor 300 is configured to receive optical signals from the LEDs 220, detect whether each of the LEDs 200 emits light normally, and collect and process location information of the LEDs that emit light normally for subsequent transfer operations. The sensor 300 may adopt an integration camera. Light emitted by the LED 220 passes through the second transparent substrate 200. The sensor 300 located below the second transparent substrate 200 can receive optical signals directly. Alternatively, the sensor 300 can be disposed both above the first transparent substrate 100 and below the second transparent substrate 200. Data received by the sensor 300 disposed above the first transparent substrate 100 and data received by the sensor 300 below the second transparent substrate 200 can be compared and analyzed for mutual calibration, which is possible to determine more accurately whether each of the LEDs 220 operates normally and reduce probability of error in data.

In some implementations, in order to facilitate control of the multiple TFTs 110, a metal line layer 120 is disposed between the first transparent substrate 100 and the multiple TFTs 110. The metal line layer 120 includes a data line circuit (that is, signal line circuit) and a scan line circuit. Circuits on the metal line layer 120 are separately electrically coupled with and power each of the multiple TFTs 110 respectively, which is beneficial to controlling individually each of the multiple TFTs 110.

Figure 4:
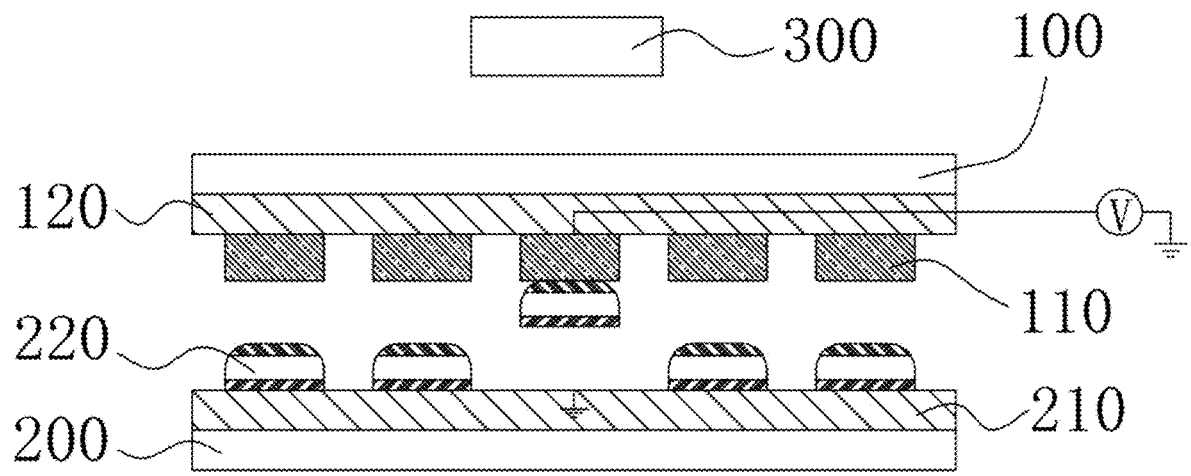
FIG. 4 is a cross-sectional view illustrating principles of absorption of an LED in a system for detecting an LED according to implementations.

As illustrated in FIG. 4, when the multiple LEDs 220 need to be detected, the multiple TFTs 110 and the multiple LEDs 220 are in one-to-one correspondence and spaced apart by a gap. A driving voltage having a certain waveform is applied to the metal line layer 120, such that each of the multiple TFTs 110 is energized. The protective layer 114 of the TFT 110 is made of a dielectric material, and therefore the protective layer 114 of the TFT 110 serves as a dielectric layer. The TFT 110, the protective layer 114, and the conductive layer 210 that is coupled with the LED 220 corresponding to the TFT 110 form a capacitor, where the TFT 110 and the conductive layer 210 are used as two electrodes of the capacitor. Voltage ramp forward biases the LED 220 in the capacitor, such that current can be generated between two electrodes of the LED 220 through capacitive coupling. In this way, an LED 220 that operates normally (hereinafter, "normal LED" for short) emits light, and an LED 220 that cannot operate normally does not emit light. By adopting the above manner, instead of adopting a low-efficiency detection manner in which a probe is mechanically moved many times and conducts direct electrical contact, all the LEDs 220 can be detected without contact, which is extremely high in detection efficiency.

When the LEDs 220 emit light, the sensor 300 disposed above the first transparent substrate 100 receives optical signals from the LEDs 220, processes obtained information, determines whether each of the LEDs 220 operates normally, and records location information of the normal LED(s) 220.

According to the location information obtained by the sensor 300, the TFT 110 corresponding to the normal LED 220 is powered by circuits on the metal line layer. In this case, the TFT 110 generates static electricity to absorb the LED 220 that is detected to operate normally, thereby distinguishing the normal LED 220 from an abnormal LED 220.

In the system for detecting an LED provided herein, the first transparent substrate 100 is provided with the metal line layer 120. The metal line layer 120 is provided with the multiple TFTs 110 that are in one-to-one correspondence with the LEDs 220. The second transparent substrate 200 is provided with the conductive layer 210, and the conductive layer 210 is provided with the LEDs 220 to-be-detected. When the LEDs 220 need to be detected, a voltage having a certain waveform is applied to the metal line layer 120. Each of the multiple TFTs 110 and the conductive layer 210 form a capacitor. Voltage ramp forward biases the LED 220 in the capacitor, such that displacement current can be generated inside the LED 220. The sensor 300 receives and detects optical signals, acquires location information, and applies, according to the location information, a voltage to the TFT 110 corresponding to the normal LED 220. As such, the TFT 110 generates static electricity and thus absorbs, with aid of the static electricity, the normal LED 220, thereby distinguishing the normal LED 220 from the abnormal LED 220. The system provided herein can detect the LEDs 220 at a high efficiency and achieve accurate batch transfer of the LEDs 220, which improves efficiency and accuracy in detecting the LEDs 220.

Figure 6:
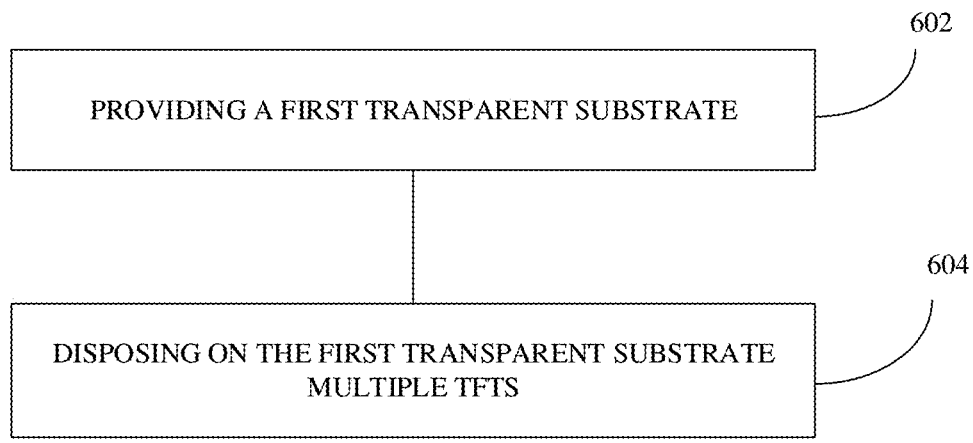
FIG. 6 is a schematic flowchart illustrating a method for preparing a system for detecting an LED according to implementations.

FIG. 6 is a schematic flowchart illustrating a method for preparing a system for detecting an LED according to implementations. As illustrated in FIG. 6, the method begins at 601.

At 602, a first transparent substrate is provided.

At 604, multiple TFTs are disposed on the first transparent substrate. The multiple TFTs are controlled separately and in one-to-one correspondence with LEDs to-be-detected in terms of location.

In some implementations, the method further includes the following operation. A conductive layer is provided, where the conductive layer is configured to be coupled with one electrode of each of the LEDs to-be-detected.

In some implementations, the method further includes the following operation. A second transparent substrate is disposed on the conductive layer.

In some implementations, the method further includes the following operation. A sensor is disposed below the second transparent substrate or above the first transparent substrate, where the sensor is configured to detect whether each of the LEDs emits light normally.

Figure 7:
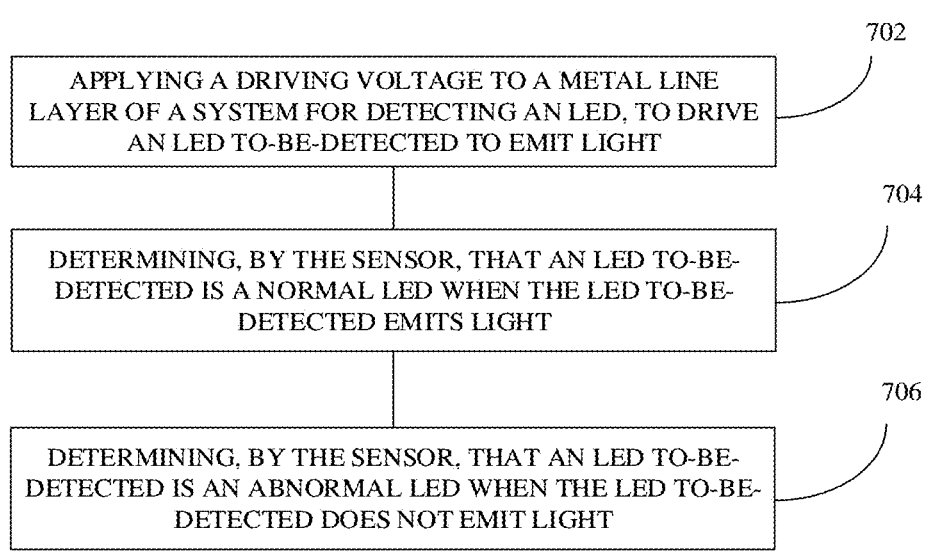
FIG. 7 is a schematic flowchart illustrating a method for detecting an LED according to implementations.

FIG. 7 is a schematic flowchart illustrating a method for detecting an LED according to implementations. As illustrated in FIG. 7, the method begins at 702.

At 702, a driving voltage is applied to a metal line layer of a system for detecting an LED, to drive an LED to-be-detected to emit light.

The system for detecting an LED includes: a first transparent substrate, multiple TFTs disposed on the first transparent substrate and controlled separately, and a sensor disposed below a second transparent substrate or disposed above the first transparent substrate, where the metal line layer is sandwiched between the first transparent substrate and the multiple TFTs, and the multiple TFTs are in one-to-one correspondence with LEDs to-be-detected in terms of location.

At 704, determine, by the sensor, that an LED to-be-detected is a normal LED when the LED to-be-detected emits light.

At 706, determine, by the sensor, that an LED to-be-detected is an abnormal LED when the LED to-be-detected does not emit light.

In some implementations, the method further includes the following operation. Location information of the normal LED is recorded by the sensor.

In some implementations, the method further includes the following operations. A TFT corresponding to the normal LED is powered by the metal line layer according to the location information, to generate static electricity. The normal LED is absorbed by the TFT corresponding to the normal LED through the generated static electricity.

The system for detecting an LED, the method for preparing a system for detecting an LED, and the method for detecting an LED have been described in detail above. While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A system for detecting a light-emitting diode (LED), comprising:
 a first transparent substrate; and
 a plurality of thin film transistors (TFT) disposed on the first transparent substrate and controlled separately, wherein the plurality of TFTs are in one-to-one correspondence with LEDs to-be-detected in terms of location, wherein
 the TFT comprises a protective layer made of a dielectric material, the TFT and a conductive layer that is coupled with the LED corresponding to the TFT form a capacitor, the protective layer serves as a dielectric layer, and the TFT and the conductive layer are used as two electrodes of the capacitor;
 the system further comprises a metal line layer disposed between the first transparent substrate and the plurality of TFTs and configured to be coupled with and control separately each of the plurality of TFTs, wherein the metal line layer comprises a data line circuit and a scan line circuit, and circuits on the metal line layer are separately electrically coupled with and power each of the plurality of TFTs respectively, to control each of the plurality of TFTs individually;
 a driving voltage having a certain waveform is applied to the metal line layer to energize each TFT, and voltage ramp forward biases the LED in the capacitor, to generate current between two electrodes of the LED through capacitive coupling, and an LED that operates normally emits light and an LED that operates abnormally does not emit light; and
 the TFT corresponding to the normally operated LED is powered by a circuit on the metal line layer, and the TFT corresponding to the normally operated LED generates static electricity to absorb the LED normally operated, to achieve batch transfer of LEDs.

2. The system of claim 1, further comprising:
 a conductive layer configured to be coupled with one electrode of each of the LEDs to-be-detected, wherein the other electrode of each of the LEDs to-be-detected is opposite to one of the plurality of TFTs.

3. The system of claim 2, further comprising:
 a second transparent substrate on which the conductive layer is disposed.

4. The system of claim 3, wherein each of the plurality of TFTs and each of the LEDs are spaced apart by a gap.

5. The system of claim 4, further comprising:
 a sensor configured to detect whether each of the LEDs emits light normally.

6. The system of claim 5, wherein the sensor is disposed below the second transparent substrate or disposed above the first transparent substrate.

7. The system of claim 1, wherein the protective layer covers a gate, a drain, and a source of the TFT.

8. The system of claim 7, wherein the protective layer is made of one of silicon nitride ($Si_3N_4$), aluminum oxide ($Al_2O_3$), and hafnium dioxide ($HfO_2$).

9. A method for preparing a system for detecting a light-emitting diode (LED), comprising:
 providing a first transparent substrate;
 disposing on the first transparent substrate a plurality of thin film transistors (TFT), wherein the plurality of TFTs are controlled separately and in one-to-one correspondence with LEDs to-be-detected in terms of location, wherein the TFT comprises a protective layer made of a dielectric material, the TFT and a conductive layer that is coupled with the LED corresponding to the TFT form a capacitor, the protective layer serves as a dielectric layer, and the TFT and the conductive layer are used as two electrodes of the capacitor; and
 providing a metal line layer, wherein the metal line layer is disposed between the first transparent substrate and the plurality of TFTs and configured to be coupled with and control separately each of the plurality of TFTs, wherein the metal line layer comprises a data line circuit and a scan line circuit, and circuits on the metal line layer are separately electrically coupled with and power each of the plurality of TFTs respectively, to control each of the plurality of TFTs individually, wherein
 a driving voltage having a certain waveform is applied to the metal line layer to energize each TFT, and voltage ramp forward biases the LED in the capacitor, to generate current between two electrodes of the LED through capacitive coupling, and an LED that operates normally emits light and an LED that operates abnormally does not emit light; and
 the TFT corresponding to the normally operated LED is powered by a circuit on the metal line layer, and the TFT corresponding to the normally operated LED generates static electricity to absorb the normally operated LED, to achieve batch transfer of LEDs.

10. The method of claim 9, further comprising:
 providing a conductive layer, wherein the conductive layer is configured to be coupled with one electrode of each of the LEDs to-be-detected.

11. The method of claim 10, further comprising:
 disposing on the conductive layer a second transparent substrate.

12. The method of claim 11, further comprising:
 disposing a sensor below the second transparent substrate or above the first transparent substrate, wherein the sensor is configured to detect whether each of the LEDs emits light normally.

13. A method for detecting a light-emitting diode (LED), comprising:
 applying a driving voltage having a certain waveform to a metal line layer of a system for detecting an LED, to drive an LED to-be-detected to emit light, wherein the system for detecting an LED comprises: a first transparent substrate, a plurality of thin film transistors (TFT) disposed on the first transparent substrate and controlled separately, and a sensor disposed below a second transparent substrate or disposed above the first transparent substrate, and wherein the metal line layer is sandwiched between the first transparent substrate and the plurality of TFTs and configured to be coupled with and control separately each of the plurality of TFTs, wherein the metal line layer comprises a data line circuit and a scan line circuit, and circuits on the metal line layer are separately electrically coupled with and power each of the plurality of TFTs respectively, to control each of the plurality of TFTs individually, wherein the plurality of TFTs are in one-to-one correspondence with LEDs to-be-detected in terms of location, wherein the TFT comprises a protective layer made of a dielectric material, the TFT and a conductive layer that is coupled with the LED corresponding to the TFT form a capacitor, the protective layer serves as a dielectric layer, and the TFT and the conductive layer are used as two electrodes of the capacitor, and wherein the driving voltage having the certain waveform is applied to the metal line layer to energize each TFT, and voltage ramp forward biases the LED in the capacitor, to generate current between two electrodes of the LED through capacitive coupling;

determining, by the sensor, that an LED to-be-detected is a normal LED when the LED to-be-detected emits light;

determining, by the sensor, that an LED to-be-detected is an abnormal LED when the LED to-be-detected does not emit light;

powering, by a circuit on the metal line layer, the TFT corresponding to the normal LED, to generate static electricity; and absorbing the normal LED by the TFT corresponding to the normal LED through the generated static electricity, to achieve batch transfer of LEDs.

14. The method of claim 13, further comprising:

recording, by the sensor, location information of the normal LED.

\* \* \* \* \*